(12) United States Patent
Nienhuys et al.

(10) Patent No.: US 10,495,976 B2
(45) Date of Patent: Dec. 3, 2019

(54) ATTENUATION APPARATUS AND METHOD

(71) Applicant: ASML Netherlands B.V., Veldhoven (NL)

(72) Inventors: Han-Kwang Nienhuys, Utrecht (NL); Gosse Charles De Vries, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/753,226

(22) PCT Filed: Aug. 3, 2016

(86) PCT No.: PCT/EP2016/068528
§ 371 (c)(1),
(2) Date: Feb. 16, 2018

(87) PCT Pub. No.: WO2017/036720
PCT Pub. Date: Mar. 9, 2017

(65) Prior Publication Data
US 2018/0239259 A1    Aug. 23, 2018

(30) Foreign Application Priority Data
Sep. 3, 2015 (EP) .................................... 15183681

(51) Int. Cl.
*G03F 7/20* (2006.01)
*G02B 26/02* (2006.01)

(52) U.S. Cl.
CPC ....... *G03F 7/70191* (2013.01); *G02B 26/023* (2013.01); *G03F 7/70025* (2013.01);
(Continued)

(58) Field of Classification Search
CPC .............. G02B 26/023; G03F 7/70025; G03F 7/70033; G03F 7/70158; G03F 7/70191; G03F 7/70525; G03F 7/7055
(Continued)

(56) References Cited

U.S. PATENT DOCUMENTS 4,778,263 A * 10/1988 Foltyn ................ G02B 5/285
359/580
2,745,435 A    12/1993 Hettrick
(Continued)

FOREIGN PATENT DOCUMENTS

DE    10 2013 209042 A1    5/2014
DE    10 2014 203348 A1    8/2015
(Continued)

OTHER PUBLICATIONS

International Search Report and Written Opinion of the International Searching Authority directed to related International Patent Application No. PCT/EP2016/068528, dated Nov. 15, 2016; 10 pages.
(Continued)

*Primary Examiner* — Colin W Kreutzer
(74) *Attorney, Agent, or Firm* — Sterne, Kessler, Goldstein & Fox P.L.L.C.

(57) ABSTRACT

An apparatus (60) for adjusting an intensity of radiation. The apparatus comprises a grating (61) for receiving a radiation beam ($B_a$) and for directing at least a portion of the radiation beam in a first direction in the form of a first reflected radiation beam ($B_{a0}$), and one or more first actuators operable to rotate the grating to adjust a grazing angle between the radiation beam and a surface of the grating so as to vary an intensity of the reflected radiation beam.

16 Claims, 9 Drawing Sheets

(52) U.S. Cl.
CPC ........ *G03F 7/70033* (2013.01); *G03F 7/7055* (2013.01); *G03F 7/70158* (2013.01); *G03F 7/70525* (2013.01)

(58) Field of Classification Search
USPC .......................... 355/67, 71; 359/224.2, 572
See application file for complete search history.

(56) References Cited

U.S. PATENT DOCUMENTS

| | | | |
|---|---|---|---|
| 6,864,490 | B1 | 3/2005 | Underwoord et al. |
| 7,145,640 | B2 | 12/2006 | Voorma et al. |
| 2005/0206869 | A1* | 9/2005 | Voorma .............. G03F 7/70558 355/67 |
| 2005/0274897 | A1 | 12/2005 | Singer et al. |
| 2010/0231877 | A1* | 9/2010 | Wolschrijn .......... G03F 7/70141 355/66 |
| 2012/0235066 | A1* | 9/2012 | Ershov ................ G03F 7/70033 250/504 R |
| 2016/0357114 | A1 | 12/2016 | Deguenther et al. |

FOREIGN PATENT DOCUMENTS

| | | | | |
|---|---|---|---|---|
| EP | 1 413 543 | A1 | 4/2004 | |
| JP | S54150147 | A | 11/1979 | |
| JP | 07244199 | A * | 9/1995 | ......... G03F 7/70058 |
| JP | 2010-014418 | A | 1/2010 | |
| JP | 2010014418 | A * | 1/2010 | |
| SU | 1506418 | A1 | 9/1989 | |
| WO | WO-2014202585 | A2 * | 12/2014 | ............... G02B 1/06 |

OTHER PUBLICATIONS

International Preliminary Report on Patentability directed to related International Patent Application No. PCT/EP2016/068528, dated Mar. 6, 2018.

Feng et al., "System Design for Self-seeding the LCLS at Soft X-Ray Energies," FEL Technology I: Gun, Injector, Accelerator, 2012; pp. 205-212.

Poletto L. "Beam Handling Devices," LUXOR—Laboratory for UV and X-Ray Optical Research, INFN-LNF, May 9, 2005; 6 pages.

Faustlin et al., "A compact soft X-ray spectrograph combining high efficiency and resolution," IOP Publishing for SISSA, Feb. 5, 2010; 11 pages.

Lee et al., "Fiber Optic Sensors: Chapter 7: Interrogation Techniques for Fiber Grating Sensors and the Theory of Fiber Gratings," Mar. 15, 2002; pp. 295-381.

Poleshchuk et al., "High-energy diffractive variable attenuator," International Conference on Lasers, Applications, and Technologies: High-Power Lasers and Applications, SPIE, vol. 6735, 2007; pp. R1-R10.

Braig et al., "An EUV beamsplitter based on conical grazing incidence diffraction," Optical Society of America, Optics Express, vol. 20, No. 2, Jan. 16, 2012; pp. 1825-1838.

* cited by examiner

ATTENUATION APPARATUS AND METHOD

CROSS-REFERENCE TO RELATED APPLICATIONS

This application claims priority of EP 15183681.4 which was filed on Sep. 3, 2015 and which is incorporated herein in its entirety by reference.

FIELD

The present invention relates to an attenuation apparatus and is particularly, but not exclusively suitable for attenuating a laser EUV radiation beam produced by a free electron laser for use within a lithographic system.

BACKGROUND

A lithographic apparatus is a machine constructed to apply a desired pattern onto a substrate. A lithographic apparatus can be used, for example, in the manufacture of integrated circuits (ICs). A lithographic apparatus may for example project a pattern from a patterning device (e.g. a mask) onto a layer of radiation-sensitive material (resist) provided on a substrate.

The wavelength of radiation used by a lithographic apparatus to project a pattern onto a substrate determines the minimum size of features which can be formed on that substrate. A lithographic apparatus which uses EUV radiation, being electromagnetic radiation having a wavelength within the range 5-20 nm, may be used to form smaller features on a substrate than a conventional lithographic apparatus (which may for example use electromagnetic radiation with a wavelength of 193 nm).

It is desirable to produce EUV radiation sources with increased power to increase throughput of EUV lithography. However, use of some EUV radiation sources may generate radiation with a power in excess of that which can be used effectively at the substrate. It is therefore also desirable to produce EUV radiation that can be used effectively at the substrate.

It is an object of at least one embodiment of the present invention to obviate or mitigate at least one of the problems identified above.

SUMMARY

According to a first aspect described herein, there is provided an apparatus for adjusting an intensity of radiation, for example, radiation used in a lithographic process. The apparatus comprises a grating for receiving a radiation beam and for directing at least a portion of the radiation beam in a first direction in the form of a first reflected radiation beam. The apparatus further comprises one or more first actuators arranged to adjust an orientation of the grating so as to vary an intensity of the reflected radiation beam.

In this way, the radiation beam may be attenuated by adjustments to the orientation of the grating, the use of the grating, in place of other optical components such as a mirror allows for particularly efficient attenuation in terms of cooling requirements and in terms of magnitudes of adjustments required to effect a change in intensity of the radiation beam. The radiation beam may comprise EUV radiation.

The one or more first actuators may be operable to rotate the grating to adjust a grazing angle between the radiation beam and a surface of the grating. In some embodiments, the grating may only require particularly low amplitude adjustments. The actuator may therefore be operable to move adjust the grating through angles of less than 1 degree.

The one or more first actuators may be operable to rotate the grating about a normal to a surface of the grating so as to vary an angle between one or more grooves of the grating and a plane of incidence of the first radiation beam.

The grating may be operable to direct at least one diffracted radiation beam away from the first direction. For example, the apparatus may comprise one or more beam dumps arranged to receive the one or more diffracted radiation beams and to dissipate the power therein.

The apparatus may further comprise a reflective optic operable to receive the reflected radiation beam and to direct at least a portion of the reflected radiation beam in a second direction in a second reflected radiation beam. The apparatus may further comprise one or more second actuators arranged to adjust an orientation of the reflective optic so as to vary an intensity of the second reflected radiation beam. The reflective optic may be a mirror, or may be a second grating. In other embodiments, the reflective optic may be operable to receive a third radiation beam and to direct at least a portion of the third radiation beam towards the grating. For example, the first radiation beam received by the grating may comprise a portion of the third radiation beam reflected from the reflective optic.

The one or more second actuators may be operable to rotate the reflective optic to adjust a grazing angle between the radiation beam and a surface of the reflective optic. The one or more second actuators may be operable to rotate the reflective optic through an angle of less than 1 degree. Where the reflective optic is a grating, the one or more second actuators may be operable to rotate the reflective optic about a normal to a surface of the reflective optic so as to vary an angle between one or more grooves of the reflective optic and a plane of incidence of the second reflected radiation beam.

The reflective optic may be operable to direct one or more diffracted radiation beams away from the second direction, for example towards one or more beam dumps.

The one or more first actuators may be operable to translate the grating such that an attenuated radiation beam is directed from the attenuation apparatus in a fixed position and direction. The one or more second actuators may be operable to translate the reflective optic such that an attenuated radiation beam is directed from the attenuation apparatus in a fixed position and direction.

For example, the one or more actuators may be operable to translate either or both of the grating and the reflective optic in a direction of propagation of the radiation beam. In this way, the attenuated radiation beam that exits the attenuation apparatus may have a fixed position and direction.

The mirror may have an extent in the direction of propagation of the first radiation beam such that the first reflected radiation beam is incident upon a reflective surface of the reflective optic for all of a predetermined range of orientations of the grating.

The apparatus may further comprise a controller arranged to control the one or more first actuators to adjust the orientation of the grating. The controller may be arranged to receive indications of a radiation intensity from a sensor and to control the one or more first actuators in response to receipt of said indications. For example, the indications of a radiation intensity may be received during exposure of a wafer in a lithographic apparatus. The indications of a radiation intensity may comprise intensity values, or may comprise relative indications, such as 'greater or 'lesser'.

According to another aspect, there is provided a lithographic system comprising a radiation source operable to produce a first radiation beam; an attenuation apparatus according to the first aspect arranged to receive a first radiation beam, the first radiation beam comprising at least a portion of the main radiation beam; and at least one lithographic apparatus, the at least one lithographic apparatus being arranged to receive an attenuated radiation beam from the attenuation apparatus.

The lithographic system may further comprise a radiation beam splitting apparatus arranged to receive the main radiation beam and output at least one branch radiation beam. The first radiation beam may comprise at least a portion of the at least one branch radiation beam.

The radiation beam splitting apparatus may be arranged to output a plurality of branch radiation beams. The lithographic system may comprise a respective attenuation apparatus for each of said plurality of branch radiation beams, each attenuation apparatus arranged to receive a respective one of said plurality of branch radiation beams.

The radiation source may comprise one or more free electron lasers.

The at least one lithographic apparatus may comprise one or more mask inspection apparatus.

It will be appreciated that aspects of the present invention can be implemented in any convenient way including by way of suitable hardware and/or software. Alternatively, a programmable device may be programmed to implement embodiments of the invention. The invention therefore also provides suitable computer programs for implementing aspects of the invention. Such computer programs can be carried on suitable carrier media including tangible carrier media (e.g. hard disks, CD ROMs and so on) and intangible carrier media such as communications signals.

One or more aspects of the invention may be combined with any one or more other aspects described herein, and/or with any one or more features described in the preceding or following description.

BRIEF DESCRIPTION OF THE DRAWINGS

Embodiments of the invention will now be described, by way of example only, with reference to the accompanying schematic drawings, in which.

DETAILED DESCRIPTION

Figure 1:
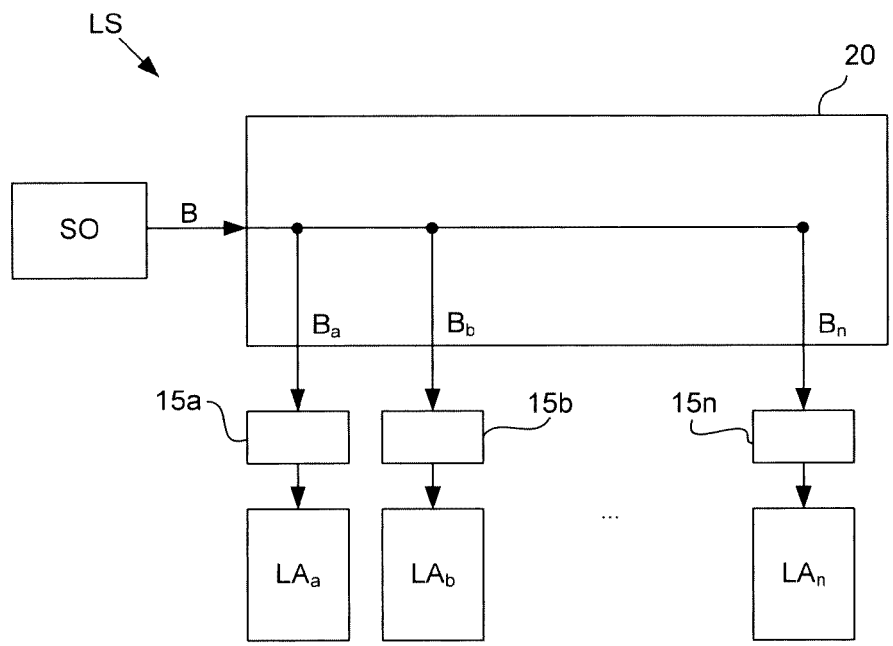
FIG. 1 depicts a lithographic system comprising an attenuation apparatus according to an embodiment of the invention.

FIG. 1 shows a lithographic system LS, including one or more attenuation apparatuses $15a$-$15n$ according to example arrangements described herein. The lithographic system LS further comprises a radiation source SO and a plurality of lithographic apparatuses $LA_a$-$LA_n$. The radiation source SO is configured to generate an extreme ultraviolet (EUV) EUV radiation beam B (which may be referred to as a main EUV radiation beam). The main EUV radiation beam B is split into a plurality of EUV radiation beams $B_a$-$B_n$, (which may be referred to as branch EUV radiation beams), each of which is directed to a different one of the lithographic apparatuses $LA_a$-$LA_n$, by the EUV radiation beam splitting apparatus 20. The branch EUV radiation beams $B_a$-$B_h$ may be split off from the main EUV radiation beam in series, with each branch EUV radiation beam being split off from the main EUV radiation beam downstream from the preceding branch EUV radiation beam. Where this is the case the branch EUV radiation beams may for example propagate substantially parallel to each other.

The radiation source SO, EUV radiation beam splitting apparatus 20 and lithographic apparatuses $LA_a$-$LA_n$ may all be constructed and arranged such that they can be isolated from the external environment. A vacuum may be provided in at least part of the radiation source SO, EUV radiation beam splitting apparatus 20 and lithographic apparatuses $LA_a$-$LA_n$ so as to minimise the absorption of EUV radiation. Different parts of the lithographic system LS may be provided with vacuums at different pressures (i.e. held at different pressures which are below atmospheric pressure).

Figure 2:
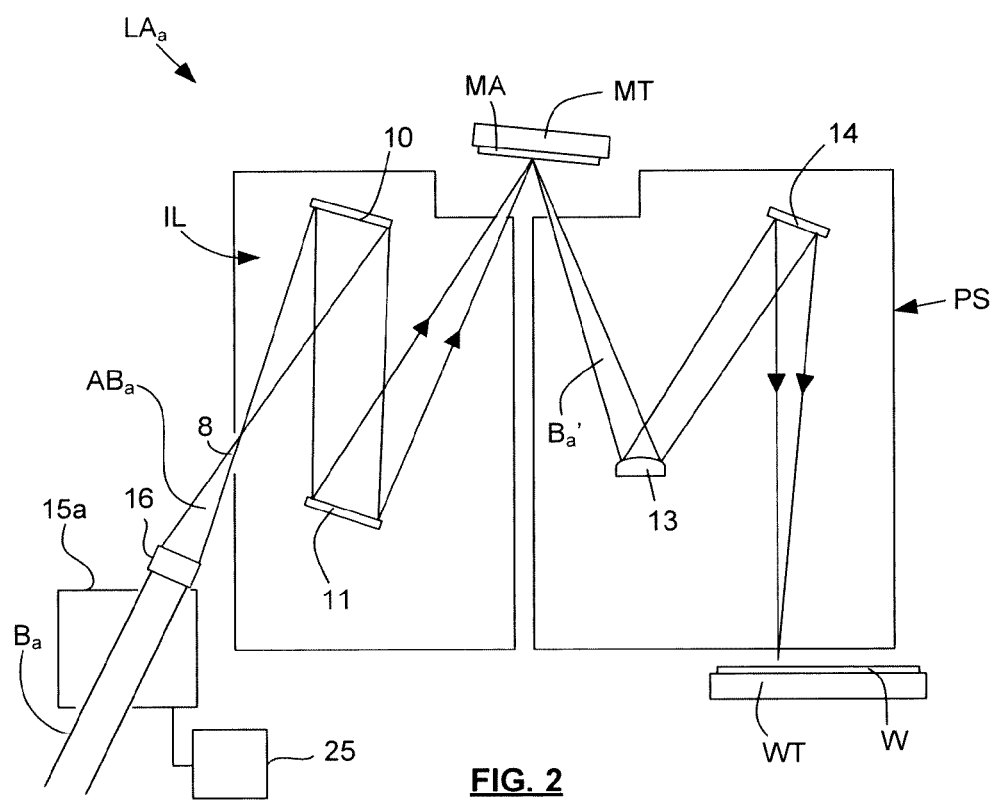
FIG. 2 depicts a lithographic apparatus that forms part of the lithographic system of FIG. 1.

Referring to FIG. 2, the lithographic apparatus $LA_a$ is shown in more detail. The lithographic apparatus $LA_a$ comprises an illumination system IL, a support structure MT configured to support a patterning device MA (e.g. a mask), a projection system PS and a substrate table WT configured to support a substrate W. The illumination system IL is configured to condition the branch EUV radiation beam $B_a$ that is received by that lithographic apparatus $LA_a$ before it is incident upon the patterning device MA. The projection system is configured to project the EUV radiation beam $B_a'$ (now patterned by the mask MA) onto the substrate W. The substrate W may include previously formed patterns. Where this is the case, the lithographic apparatus $LA_a$ aligns the patterned EUV radiation beam $B_a'$ with a pattern previously formed on the substrate W.

The branch EUV radiation beam $B_a$ that is received by the lithographic apparatus $LA_a$ passes into the illumination system IL from the EUV radiation beam splitting apparatus 20 through an opening 8 in an enclosing structure of the illumination system IL. Optionally, the branch EUV radiation beam $B_a$ may be focused to form an intermediate focus at or near to the opening 8.

The illumination system IL may include a faceted field mirror device 10 and a faceted pupil mirror device 11. The faceted field mirror device 10 and faceted pupil mirror device 11 together provide the EUV radiation beam $B_a$ with a desired cross-sectional shape and a desired angular distribution. The faceted field mirror device 10 and faceted pupil mirror device 11 may each comprise an array of independently movable mirrors. The faceted field mirror device 10 and faceted pupil mirror device 11 may comprise different numbers of independently movable mirrors. For example the faceted pupil mirror device 11 may comprise twice as many mirrors as the faceted field mirror device 10. The mirrors in the faceted field mirror device 10 and faceted pupil mirror device 11 may be of any suitable shape, for example, they may be generally banana shaped. The EUV radiation beam $B_a$ passes from the illumination system IL and is incident upon the patterning device MA held by the support structure MT. The patterning device MA reflects and patterns the EUV radiation beam to form a patterned EUV radiation beam $B_a'$. The illumination system IL may include other mirrors or devices in addition to or instead of the faceted field mirror device 10 and faceted pupil mirror device 11. The illumination system IL may for example include an array of independently moveable mirrors. The independently moveable mirrors may for example measure less than 1 mm across. The independently moveable mirrors may for example be MEMS devices.

Following reflection from the patterning device MA the patterned EUV radiation beam $B_a'$ enters the projection system PS. The projection system PS comprises a plurality of mirrors 13, 14 which are configured to project the EUV radiation beam $B_a'$ onto a substrate W held by the substrate table WT. The projection system PS may apply a reduction factor to the EUV radiation beam, forming an image with features that are smaller than corresponding features on the patterning device MA. A reduction factor of 4 may for example be applied. Although the projection system PS has two mirrors 13, 14 in FIG. 2, the projection system may include any number of mirrors (e.g. six mirrors).

The radiation source SO may comprise one or more free electron lasers, which are selectively operable to produce an EUV radiation beam of EUV radiation. A free electron laser comprises a source, which is operable to produce a bunched relativistic electron EUV radiation beam, and a periodic magnetic field through which the bunches of relativistic electrons are directed. The periodic magnetic field is produced by an undulator and causes the electrons to follow an oscillating path about a central axis. As a result of the acceleration caused by the magnetic structure the electrons spontaneously radiate electromagnetic radiation generally in the direction of the central axis. The relativistic electrons interact with the radiation within the undulator. Under certain conditions, this interaction causes the electrons to bunch together into microbunches, modulated at the wavelength of radiation within the undulator, and coherent emission of radiation along the central axis is stimulated.

The path followed by the electrons may be sinusoidal and planar, with the electrons periodically traversing the central axis, or may be helical, with the electrons rotating about the central axis. The type of oscillating path may affect the polarization of radiation emitted by the free electron laser. For example, a free electron laser which causes the electrons to propagate along a helical path may emit elliptically or circularly polarized radiation, which may be preferred for exposure of a substrate W by the lithographic apparatuses $LA_a$-$LA_n$.

Where the source SO comprises a free electron laser, the source SO may output relatively high-power radiation. For example, a free electron laser source SO may output an EUV radiation beam B that provides branch EUV radiation beams $B_a$ to $B_n$ each of the order of 1 kW or more. For some lithographic apparatus, it may be desirable to reduce an amount of radiation that is received at the lithographic apparatus. For example, a substrate of a lithographic apparatus may comprise a layer of resist which requires a dose of radiation of approximately 5 mJ/cm². Receipt of a high-power branch EUV radiation beam at that lithographic apparatus may cause difficulties in ensuring that the resist is provided with a suitable dose of radiation. One way to decrease the dose of radiation received at a portion of the substrate is to move the substrate with respect to the radiation incident upon the substrate (scanning). It may be difficult, however, to achieve a sufficiently high scan speed to achieve a desired dose of radiation at the substrate.

In embodiments of the present invention, one or more of the branch EUV radiation beams $B_a$-$B_n$ are directed through respective attenuation apparatuses 15a-15n. Each attenuation apparatus 15a-15n is arranged to adjust the intensity of a respective branch EUV radiation beam $B_a$-$B_n$ to provide an attenuated the branch EUV radiation beam $AB_a$-$AB_n$ to the illumination system IL of its corresponding lithographic apparatus $LA_a$-$LA_n$.

Figure 3:
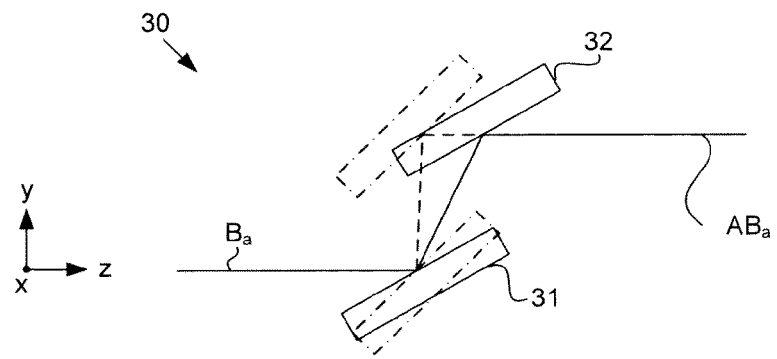
FIG. 3 is a schematic illustration of a proposed dynamic attenuator utilizing adjustable mirrors.

It has been proposed to provide a dynamic attenuator using an arrangement of rotatable mirrors. One proposed dynamic attenuator arrangement 30 is schematically illustrated in FIG. 3. The arrangement 30 comprises two reflective optics in the form of mirrors 31, 32. The second mirror 32 is separated, in a depicted y-direction, from the first mirror 32. The first mirror 31 is arranged so that the branch EUV radiation beam $B_a$, entering the attenuation apparatus 15a is incident on a reflective surface of the first mirror 31 and reflected by the reflective surface towards a reflective surface of the second mirror 32. The second mirror 32 is angled so as to direct an attenuated EUV radiation beam $AB_a$ towards the lithographic apparatus $LA_a$ (not shown in FIG. 3).

The mirrors 31, 32 are each arranged to rotate about the x-axis so as to alter the angle of incidence between the branch EUV radiation beam $B_a$ and the mirrors 31, 32. Example rotated positions of the mirrors 31, 32 are depicted in dash-dot-dash outline in FIG. 3. A path of the branch EUV radiation beam $B_a$ between the rotated positions of the mirrors 31, 32 is shown in dashed outline. It will be appreciated that the angle of rotation of the mirror 31 alters the angle of incidence, and therefore the angle of reflection, of the branch EUV radiation beam $B_a$. The mirror 32 is provided with one or more actuators (not shown) to translate the mirror 32 in the z-direction (i.e. the direction of propagation of the branch EUV radiation beam $B_a$) in order to allow the mirror 32 to be positioned in the path of the branch EUV radiation beam $B_a$ reflected from the mirror 31.

The reflectance of each of the mirrors 31, 32 is a function of the grazing angle (where the grazing angle is defined as 90 degrees minus the angle of incidence) between the reflective surfaces of the mirrors 31, 32 and the branch EUV radiation beam $B_a$. For example, for a grazing angle of 2 degrees, approximately 97.6% (in a theoretical case of a mirror having a ruthenium (Ru) coating having perfectly flat surface) of the incident radiation may be reflected at each of the mirrors 31, 32. That is, when angled at 2 degrees, radiation reflected by one of the mirrors 31, 32 is reduced by 2.4% compared to the intensity of the radiation that is incident on that mirror. As such, where both of the mirrors 31, 32 are disposed at a grazing angle of 2 degrees, the intensity of the attenuated branch EUV radiation beam $AB_a$ is reduced by approximately 4.8% through reflection by the mirrors 31, 32.

For a grazing angle of 10 degrees, approximately 88% of the incident radiation may be reflected at each of the mirrors 31, 32. That is, when the grazing angle is 10 degrees, the intensity of the reflected radiation is approximately 12% less than the incident radiation. As such, where both of the mirrors 31, 32 are disposed at a grazing angle of 10 degrees, the intensity of the attenuated branch radiation $AB_a$ is reduced by approximately 24% through reflection by the mirrors 31, 32.

From the above description, it will be appreciated that by rotation of the mirrors 31, 32 to adjust the angle of incidence, between approximately 1 and 10 degrees, the attenuation of the branch EUV radiation beam $B_a$ may be varied between approximately 2% and 20%. The dynamic attenuator 30 may be required to provide rapid adjustment of the attenuation (hence the label "dynamic") in order to compensate for undesired fluctuations in power output from the source SO. For example, it has been proposed to provide a dynamic attenuator with a response time of approximately 10 ms.

It has also been proposed to combine a dynamic attenuator (having a relatively fast response time), such as the dynamic attenuator 30 with one or more additional attenuators. For example, it has been proposed to provide a 'static' attenuator, with a variable transmittance of between approximately 10% and 100%. One proposal for a static attenuator takes the form of a gas-filled chamber. By the term 'static attenuator', it is meant herein that the time required to adjust an attenuation provided by the 'static attenuator' need not be fast. For example, a 'static' attenuator may have response time of the order of minutes.

Figure 4:
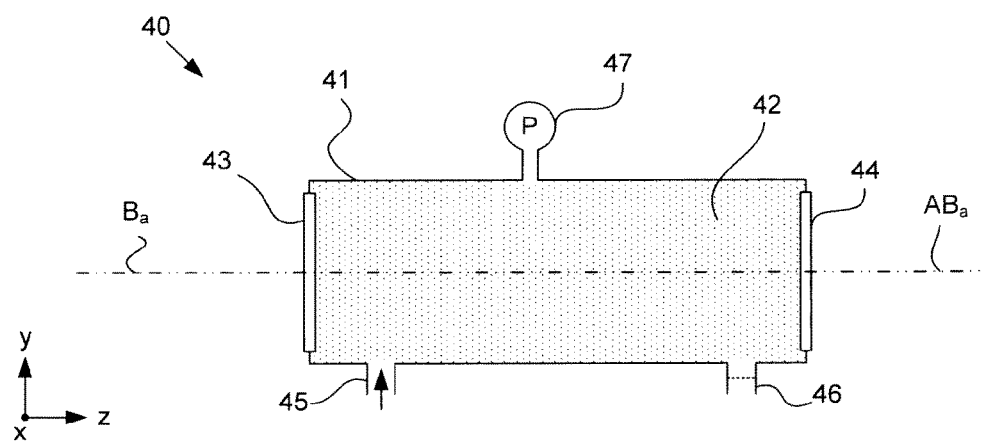
FIG. 4 is a schematic illustration of a proposed static attenuator utilizing a gas-filled chamber.

FIG. 4 schematically depicts an example of a second attenuation apparatus 40 that may be provided in combination with, or as an alternative to, a first attenuation apparatus as described above with reference to FIG. 3. The attenuation apparatus 40 comprises a housing 41 defining a chamber 42. The housing 40 may define a chamber 41 of any shape. For example, the housing 41 may be generally tubular. The chamber 42 is closed at a first end by a first window 43 and at a second, opposing end, by a second window 44. An inlet 45 is provided to allow a controlled amount of a gas, into the chamber 42. A valve 46 may also be provided to allow a controlled flow of gas from the chamber 42. A pressure monitor 47 is provided to monitor a pressure within the chamber 42. The pressure monitor 47 may be any form of pressure monitor. By providing a gas flow, rather than a fixed, enclosed gas medium, energy absorbed by the gas may be removed. The amount of energy thus removed may be substantial where the attenuation apparatus 40 provides a large attenuation factor (such as a factor of 10).

The inlet 45 allows the introduction into the chamber 42 of an EUV absorbing gas. It will be appreciated that the particular gas introduced into the chamber 42 may be selected in dependence upon a desired level of EUV absorption. As an example, however, gasses such as Hydrogen, Helium and/or Argon may be suitable. The windows 43, 44 are constructed so as to provide a high transmittance for EUV radiation and may be constructed to provide a high absorbance to other wavelengths of electromagnetic radiation. For example, the windows may comprise what are commonly referred to as spectral purity filters, which filter radiation outside of the EUV wavelength, but which allow the transmission of EUV radiation. Such spectral purity filters may be constructed in any appropriate way as will be apparent to those skilled in the art. For example, the windows 43, 44 may be constructed from molybdenum (Mo) and zirconium silicide (ZrSi). The Mo/ZrSi stack may be capped on one or both sides with molybdenum silicide (MoSi). In an alternative example the windows 43, 44 may be formed from polysilicon (pSi). One or both of the sides of the polysilicon film may be capped with a silicon nitride (SiN) layer. Other materials, for example graphene, may be suitable for use in the windows 43, 44. The thickness of the windows 43, 44 may be selected in dependence upon a maximum pressure desired within the chamber 42, which itself may be selected in dependence upon a desired attenuation.

The branch EUV radiation beam $B_a$ enters the second attenuation apparatus 40 through the first window 43 and is attenuated by way of interaction with the fluid within the chamber 42, before exiting the attenuation apparatus 40 through the second window 44. An attenuation of the branch EUV radiation beam $B_a$ caused by passage through the chamber 42 may be varied by varying the type, amount or pressure of gas within the chamber 42.

The pressure sensor, gas inlet and gas valve may be in communication with a controller. The controller may be operable to control the gas inlet 45 and the gas valve 46 to achieve a desired pressure within the chamber 42. The desired pressure within the chamber 42 may be selected so as to achieve a desired attenuation of the branch EUV radiation beam $B_a$ to be caused by the second attenuation apparatus. Alternatively or additionally, a desired pressure within the chamber 42 may be selected to maintain a pressure within the chamber 42 within a predetermined safe range.

In an alternative arrangement, differential pumping may be used in place of the windows 43, 44. In this way, there would be no requirement to cool the windows 43, 44 to prevent overheating, and loss of EUV power to the windows 43, 44 may be avoided. In a further alternative arrangement, a 'static' attenuator may be provided by a mirror with a transmittance range of between 10% to 100%. Such a mirror may be a rotating mirror in order to accommodate a heat load that may be caused by the received radiation.

Figure 5:
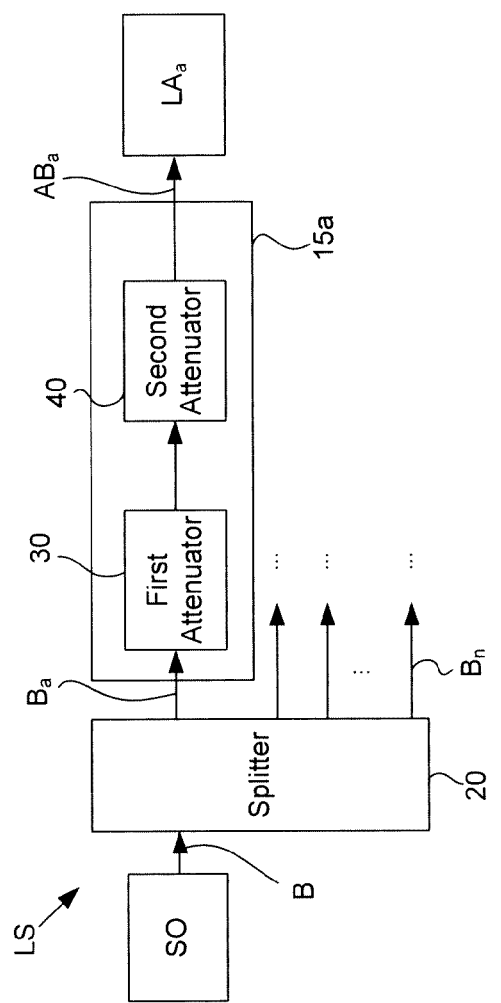
FIG. 5 is a schematic illustration of an attenuation apparatus comprising a plurality of attenuators.

FIG. 5 schematically illustrates a lithographic system LS comprising an attenuation apparatus 15a comprising both a first, dynamic attenuator 30 and a second, static attenuator 40. While the arrangement of FIG. 5 is suitable for attenuating EUV radiation beams, and from blocking the EUV radiation beams where necessary, the use of gas-based, or rotating-mirror based static attenuators present difficulties in complexity of design, manufacture, installation and maintenance together with demanding heat dissipation and space requirements within the lithographic system LS. For example, the attenuator 40 may need to dissipate as much as approximately 1.4 kW of EUV power, leading to high levels of heating of components of the attenuator 40. To dissipate such heat, it is expected that substantial quantities of water (or other cooling fluid) will need to be circulated quickly within the attenuator 40, adding greatly to the complexity of the design, installation and maintenance. Large temperature gradients may also make it more difficult to ensure a uniform attenuation across the entire cross-section of the radiation beam $B_a$. Additionally, difficulties may be encountered in accommodating any gas which may leak from the attenuator 40, into other optics vacuum vessels. Further, the attenuation apparatus 15a comprises three separate and distinct and complex modules (e.g. the attenuators 30, 40), thereby increasing the costs of the attenuation apparatus 15a.

Figure 6A:
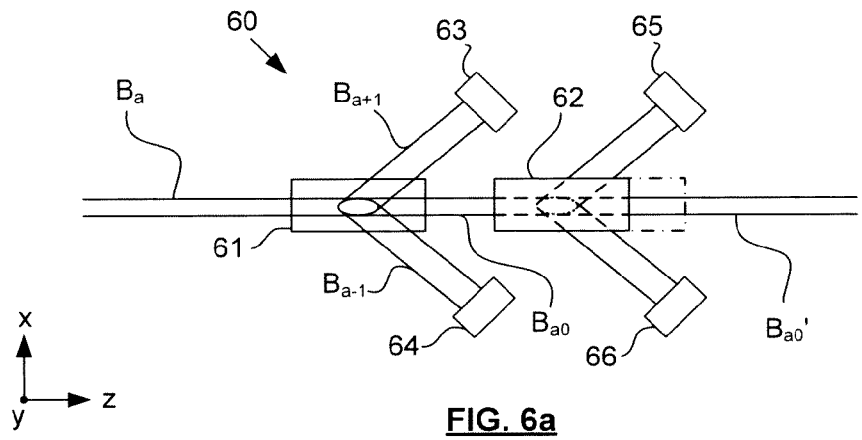
FIGS. 6a, 6b are schematic illustrations of an attenuator comprising a plurality of reflective gratings.
Figure 6B:
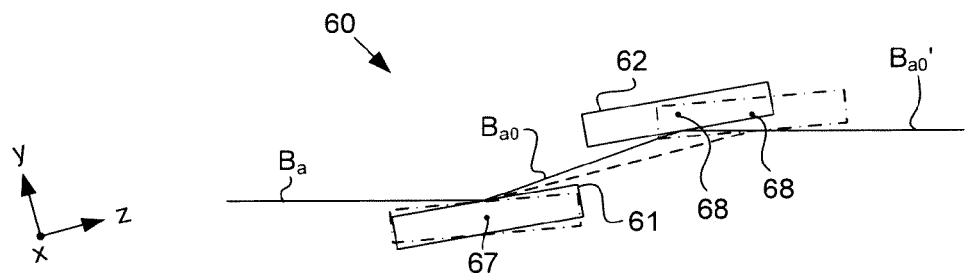

FIGS. 6a, 6b, schematically illustrates an alternative attenuator 60. FIG. 6a depicts a top-view of the attenuator 60, while FIG. 6b depicts the attenuator 60 in side-view. The attenuator 60 is arranged similarly to the attenuator 30 of FIG. 3, but in place of the mirrors 31, 32, two gratings 61, 62 are provided in the path of the branch EUV radiation beam $B_a$. The gratings 61, 62 are reflective gratings. While transmissive gratings are known, the inventors have realised that such gratings may not be desirable for lithography applications utilising EUV radiation as transmissive gratings may absorb significant amounts of EUV radiation leading to high levels of degradation of the gratings and stringent cooling requirements.

The gratings 61, 62 are arranged such that the branch EUV radiation beam $B_a$ is first incident on a reflective surface of the grating 61. It may be considered that three EUV radiation beams are created at the surface of the grating 61: a first EUV radiation beam $B_{a0}$ (diffraction order n=0), and two EUV radiation beams, $B_{a-1}$, and $B_{a+1}$ (diffraction orders n=±1). The first EUV radiation beam $B_{a0}$ may be referred to herein as a "reflected" EUV radiation beam, as the zero-order diffraction behaves according to the laws of reflection from a mirror, while the two EUV radiation beams $B_{a\pm1}$ may be referred to as "diffracted" EUV radiation beams. The two EUV radiation beams $B_{a\pm1}$ propagate along respective paths towards respective EUV radiation beam dumps 63, 64. The EUV radiation beam dumps 63, 64 may, for example, comprise a mass of material suitable for absorbing significant amounts of EUV radiation. For example, the EUV radiation beam dumps 63, 64 may comprise a body of aluminium suitable for dissipating a heat load generated by the received diffracted EUV radiation beams $B_{a\pm1}$.

The reflected EUV radiation beam $B_{a0}$ is directed onwards towards the illuminator IL. In the embodiment shown in FIG. 6, the reflected EUV radiation beam $B_{a0}$ is directed towards a reflective surface of the second grating 62. Again, it may be considered that three EUV radiation beams are created by the second grating 62: a reflected EUV radiation beam $B_{a0}'$ (diffraction order n=0), and two diffracted EUV radiation beams, $B_{a-1}'$ and $B_{a+1}'$ (diffraction orders n=±1). The two diffracted EUV radiation beams $B_{a\pm1}'$ are reflected towards respective EUV radiation beam dumps 65, 66, while the reflected EUV radiation beam $B_{a0}'$ is directed onwards to towards the illuminator IL. The reflected EUV radiation beam $B_{a0}'$ may, in some embodiments, provide the attenuated branch EUV radiation beam $AB_a$.

The amount of EUV radiation from the branch EUV radiation beam $B_a$ that is reflected in EUV radiation beam $B_{a0}$, is dependent, at least in part, on the angle of incidence of the branch EUV radiation beam $B_a$ with the first diffraction grating 61 (or, equivalently, dependent on the complementary grazing angle). Similarly, the amount of EUV radiation that is reflected in the EUV radiation beam $B_{a0}'$ is dependent, at least in part, on the angle of incidence of the reflected EUV radiation beam $B_{a0}$ with the second diffraction grating 62. For example, variance of the angle of incidence between the branch EUV radiation beam $B_a$ and the grating 61, and variance of the angle of incidence between the first reflected EUV radiation beam $B_{a0}$ and the grating 62, may be operable to adjust a transmittance of the attenuator 60 between approximately 1% and 99%. Generally, approximately 1% to 2% of the EUV energy from the branch radiation beam $B_a$ that is not reflected in the EUV radiation beams $B_{a0}$, $B_{a0}'$ is dissipated in the gratings 61, 62, with a remainder of the EUV energy being reflected in the two further reflected EUV radiation beams $B_{a\pm1}$.

The grating 61 is provided with one or more actuators arranged to rotate the grating 61 about an axis 67 extending in the x-direction and located at the centre of the grating 61, to thereby alter the angle of incidence of EUV radiation beam $B_a$ with the grating 61. Similarly, the grating 62 is provided with one or more actuators arranged to rotate about an axis 68 extending in the x-direction and located at the centre of the grating 62 to thereby alter the angle of incidence of EUV radiation beam $B_{a0}$ with the grating 62. Example rotated positions of the gratings 61, 32 are depicted in dash-dot-dash outline in FIGS. 6a, 6b. While the axes 67, 68 are at the centre of the gratings 61, 62 in the example embodiment of FIG. 6, it is to be understood that this is merely exemplary. More generally, the one or more actuators may be operable to rotate the gratings 61, 62 in any way suitable to alter an angle of incidence of the EUV radiation beams $B_a$, $B_{a0}$.

A path of the first reflected EUV radiation beam $B_{a0}$ between the rotated positions of the gratings 61, 62 is shown in dashed outline in FIG. 6b. It will be appreciated that rotation of the grating 61 alters the angle of incidence of the branch EUV radiation beam $B_a$, and therefore the angle of reflection of the reflected EUV radiation beam $B_{a0}$. As such, the grating 62 may be provided with one or more actuators (not shown) operable to translate the grating 62 in the z-direction (i.e. the direction of propagation of the branch radiation beam $B_a$). In this way, the grating 62 may be positioned to receive the first reflected EUV radiation beam $B_{a0}$ at the same position on the reflective surface of the second grating 62 (e.g. a centre position) for any orientation of the first grating 61. In this way, the reflected EUV radiation beam $B_{a0}'$ leaving the second grating 62 may propagate in the same direction and at the same position on the x-axis, thereby avoiding the need for downstream components (such as the illuminator IL) to deal with EUV radiation beams that may shift direction and position in the x-axis.

As will be appreciated from the above, by rotating the gratings 61, 62 about the pivots 67, 68 to increase or decrease the angles of incidence, the intensity of the branch EUV radiation beam $B_a$ received at the attenuator 60 may be dynamically adjusted.

Figure 7:
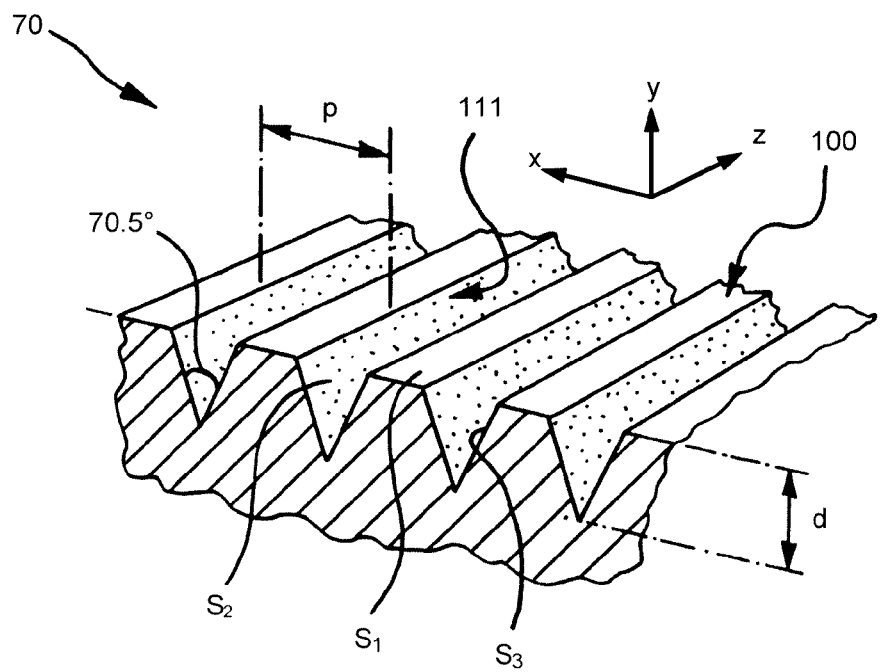
FIGS. 7, 8 are schematic illustrations of possible gratings.

The gratings 61, 62 may take any of a plurality of configurations. One example of a structure of the reflective surface of a grating 70 that may be used to provide the gratings 61, 62 is depicted in perspective view in FIG. 7. The grating 70 may be formed from silicon by, for example, anisotropic etching along crystal planes of a silicon wafer. Referring to FIG. 7, and assuming that the grating 70 is formed from silicon, top faces $S_1$ may be formed along the (100) crystallographic plane and faces $S_2$, $S_3$ formed along the {111} crystallographic planes. In this case, the angle at the bottom of the grooves (e.g. between the faces $S_2$ and $S_3$) will be approximately 70.5 degrees. The grooves and ridges of the grating 70 will extend along the <01$\bar{1}$> direction. The direction of the incoming EUV radiation beam (e.g. $B_a$ or $B_{a0}$) is be disposed at a small (grazing) angle to the <01$\bar{1}$> direction. It will be appreciated that various layouts are possible depending on the <h k l> direction of top the surface of the grating.

As in the example described above, a grating in which the top faces $S_1$ are formed along the (100) crystallographic plane and the faces $S_2$, $S_3$ are formed along the {111} crystallographic planes would form three EUV radiation beams, with the ratios of intensities of the formed EUV radiation beams being dependent on the ratio of the width of the $S_1$ faces to the pitch p of the grating, groove depth d, as well as upon angle of incidence of the EUV radiation beam upon the grating and the angle the grooves make with respect to the plane of incidence of incident EUV radiation beam (which can be 0 degrees—grooves parallel to the incident EUV radiation beam; 90 degrees—grooves perpendicular to the incident EUV radiation beam; or any other angle).

Figure 8:
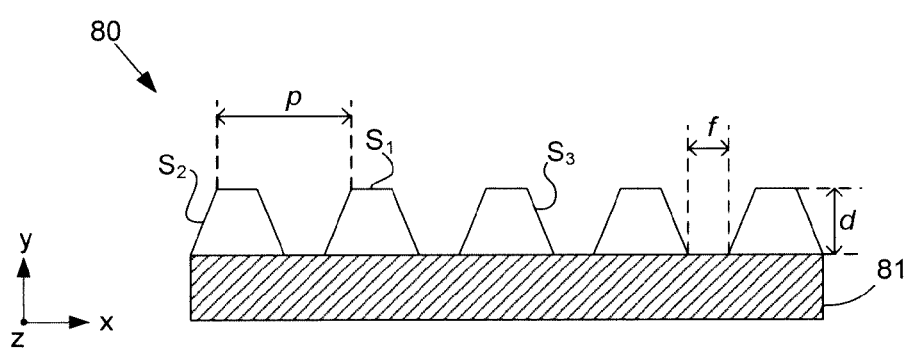

FIG. 8 illustrates an alternative embodiment of a grating 80 in side-view. Like the grating 70, the grating 80 comprises a plurality of ridges having three groups of face features; a first group of face features $S_1$, a second group of face features $S_2$ and a third group of face features $S_3$. In the example embodiment of FIG. 8, however, the $S_2$ face of each ridge is separated from the $S_3$ face of an adjacent ridge by a distance f at the closest points of each face. The distance f can be selected so as to ensure that radiation reflected from an $S_2$ or an $S_3$ face is not subsequently incident on an $S_2$ or $S_3$ face of an adjacent ridge.

The grating 80 may be constructed, for example, by providing a base portion 81 of a material that is etch resistant with respect to the etching process used to etch a top layer of silicon to provide the ridges. For example, the base portion may be made from silicon dioxide (SiO2) or silicon nitride (Si3N4). Alternatively, the etch process may be stopped before a full V-shaped groove has formed in the silicon.

The gratings 70, 80 may generally be characterized by the pitch p and the groove depth d (and the distance f where non-zero), and selection of different pitches p and groove depths d (and distances f) can be used to provide attenuators with varying attenuation properties. Generally, for different classes of shape of gratings, different relationships will exist between groove depth d, the distance f, the pitch p and the attenuation provided at different incidence angles. For example, for a grating that has grooves with vertical side walls (e.g., having a profile of a square wave), and where d<p, a maximum suppression of the EUV radiation beams $B_{a-1}$ and $B_{a+1}$, (diffraction orders n=±1) (i.e., close to 100% reflectance) may occur if the grazing angle $\beta$ (in radians) <$\lambda$/p, where $\lambda$ is the wavelength of the incident radiation beam $B_a$. For this class of grating shapes (e.g., vertical grooves and d<p), maximum attenuation of the EUV radiation beam $B_{a0}$ (i.e., diffraction order n=0) may occur when $\beta d \approx \lambda/4$, for a grating with a "duty cycle" (i.e., the ratio of distance f to pitch p) of 50%. As such, for this class of grating shapes, to provide a grating that has its minimum attenuation at a grazing angle $\beta_1$ and maximum attenuation at a grazing angle $\beta_2$, values of $\rho=\lambda/\beta_1$ and $d\approx\lambda/(4\beta_2)$, may be selected, with $\beta_1<\beta_2$.

It will be appreciated that other relationships may hold for other classes of grating shape. However, it will also be appreciated that the above described relationships for gratings where d<p and which have vertical grooves may be used as approximations for other grating shapes.

In one embodiment, it may be desired to provide an attenuator that is adjustable to provide, at one extreme, 0% diffraction and 99% specular reflection (i.e., a minimum attenuation), and to provide, at the other extreme, >44% diffraction (in both n=+1 and n=−1 diffraction orders) and <10% specular reflectance (i.e., a maximum attenuation). To provide such an attenuator, it is generally desirable to ensure that the grazing angle is as small as possible. For example, it may be ensured that the grazing angle is below approximately 4 degrees. For an attenuator which will accept an incident radiation beam at a grazing angle in the range $\beta_1<\beta<\beta_2$, with minimal 0th-order reflection (i.e., maximum attenuation) at angle $\beta_2$, and maximal 0th-order reflection (i.e., minimum attenuation) at angle $\beta_1$, the groove pitch p may be selected such that the that the n=+1 and n=−1 diffraction orders are suppressed at angles $\beta<\beta_1$, providing the condition $\rho=\lambda/\beta_1$ discussed above.

Suppression of the zero-order diffraction order radiation beam may be expected when $d\beta_2/\lambda \approx j/2+\frac{1}{4}$, where j is a positive integer. It will be appreciated that in the example provided above, j=0, to provide the condition $d\approx\lambda/(4\beta_2)$, which may provide a particularly practical arrangement.

By way of example only, taking the above relationships, a grating which is tunable between approximately 0.98 and 4 degrees for EUV radiation with a wavelength of 13.5 nm may have a pitch p=794 nm and a depth d=48 nm.

Figure 9B:
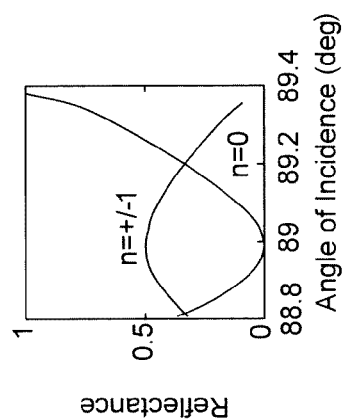
FIGS. 9a, 9b are charts depicting changes in zero-order reflectance with angle of incidence for respective grating configurations.
Figure 9A:
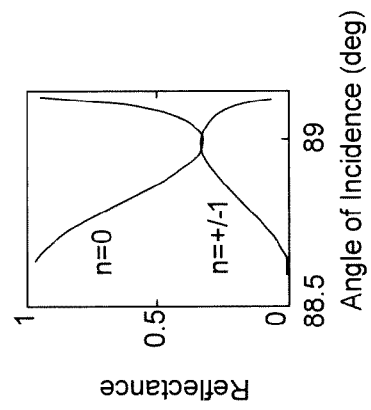

FIGS. 9a, 9b show how the zero-order reflectance changes with angle of incidence for two possible grating configurations (each with a distance f of zero, and with "V" shaped grooves, rather than vertical-walled grooves). FIG. 9a depicts a reflectance curve for a grating with a pitch, p=880 nm and a groove depth, d=542 nm. In FIG. 5a, for an EUV radiation beam with a grazing angle of between approximately 1.4 and 0.9 degrees, zero-order reflectance varies from approximately 32% and 96%. It will be appreciated, therefore, that by providing two such gratings in series (as in the attenuator 60 of FIG. 6), an attenuator may be controlled to provide a dynamic attenuation range of between approximately 8% and 90%.

FIG. 9b depicts a reflectance curve for a grating with a pitch, p=1240 nm and a groove depth, d=490 nm. In FIG. 9b, for an EUV radiation beam with a grazing angle of between approximately 1.0 and 0.65 degrees, zero-order reflectance varies between approximately 1% and 99%. Using the above discussed criteria of $\rho=\lambda/\beta_1$ and $d\approx\lambda/(4\beta_2)$, it may be expected that such values would be achieved with a grating having p=1240 nm, d=192 nm. However, as noted above, in the grating for FIG. 9b, the depth d is for a V-shaped groove, not a vertical-walled groove. The "average depth" of such a groove is 245 nm, which it will be appreciated is comparable to the approximated result of 192 nm.

Generally, when choosing grating parameters, a trade-off may be made. Gratings with larger pitches p may be easier to manufacture, while gratings with larger depth values d may be more difficult. A larger difference between the maximum and minimum grazing angles $\beta_2$-$\beta_1$ may be less sensitive to small angle errors but may require a larger actuation range. Some sufficiently small values of a minimum attenuation grazing angle $\beta_1$ may require larger gratings to capture the entire of the incoming EUV beam $B_a$.

It will be appreciated, therefore, that by providing two such gratings in series, an attenuator may be controlled to provide a dynamic attenuation range of between approximately 2% and 99.99%. While two example configurations of attention gratings are described with reference to FIGS. 9a, 9b, these are merely exemplary, and that other configurations (e.g. different pitches and groove depths) may be used depending on the particular attenuation requirements of the lithographic system.

With reference again to FIG. 6, it will further be appreciated, from the above, that very small adjustments in the angles of the gratings 61, 62, can be used to effect large adjustments in the attenuation provided by the attenuator 60. The small angular ranges through which the gratings 61, 62 are adjusted is such that the response time (i.e. the time it takes to achieve a desired attenuation) of the attenuator 60 may be much shorter than that of the attenuator 30 for a given maximum force that may be applied by an actuator. Generally, for small amplitude movements, there may not be much difference in bandwidth (i.e., maximum number of adjustments per unit of time) for the mirror-based attenuator 30 in FIG. 3 compared to the grating-based attenuator 60. For such small amplitudes of movement, the bandwidth is generally limited by the mechanical resonance frequency of the mirror/grating. However, for large amplitudes of movement, the bandwidth will be limited by the maximum force generated by the actuator. For example, in order to translate a 5 kg mirror assembly at 100 Hz with 1 cm amplitude, 20 kN is required, and an instantaneous power of −60 kW.

As indicated above, absorption of EUV radiation in each grating is generally approximately 1% to 2% of the incident EUV radiation beam, generating a heat load of only 30 W to 60 W of EUV power. As such, cooling requirements for the gratings 61, 62 of the attenuator 60 may be considerably less than the cooling requirements for the mirrors 31, 32 of the attenuator 30. Additionally, while diffraction is generally sensitive to the wavelength of incident radiation, the zero-order reflection of a grazing-incidence EUV radiation beam is suitably insensitive to wavelength that the attenuator 60 may be used even where the source SO provides an EUV radiation beam B with a fluctuating wavelength.

Additionally, while it is proposed to combine the attenuator 30 with a static attenuator 40 (as shown in FIG. 5) in an attenuation apparatus 15a, the large range of attenuation that is achievable with the attenuator 60 is such that the attenuator 60 may replace the functionality of the static attenuator 40, in some embodiments. Additionally, where the attenuator 60 is configured to provide large attenuations (e.g., 99%), the attenuator 60 may provide the functionality of a shutter in some embodiments. As such, use of the attenuator 60 may decrease costs compared to the attenuation apparatus 15a shown in FIG. 5.

As described above, in addition to the angle of incidence, the zero-order reflectance is dependent upon the angle the grooves of a grating make with respect to the plane of incidence of an incident EUV radiation beam. As such, in some embodiments, one or more of the gratings 61, 62 may additionally or alternatively be provided with actuators operable to rotate the gratings 61, 62 about an axis normal to the reflective surfaces of the gratings 61, 62 (i.e., varying the azimuthal angle of the grating).

Figure 10A:
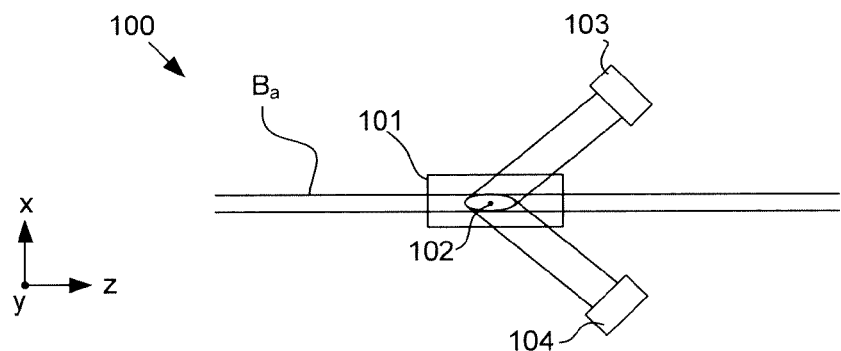
FIGS. 10a, 10b are schematically illustrations of an attenuator comprising a single grating.
Figure 10B:
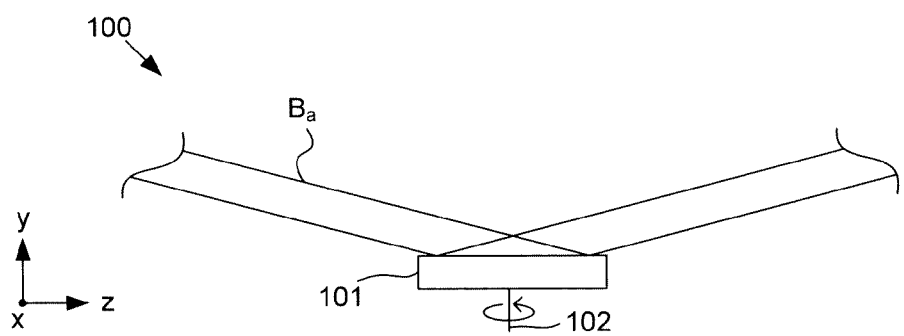

FIGS. 10a, 10b schematically depict an attenuator 100, comprising a grating 101 arranged to rotate about an axis 102 which extends in the y-direction. While the axis 102 is depicted at a center of the grating 101, it is to be understood that this is merely exemplary. Through rotation of the grating about the axis 102, the amount of EUV radiation that is reflected in the zero-order EUV radiation beam may be adjusted, thereby adjusting the attenuation provided by the attenuator 100. The diffraction orders ±1 are directed towards respective EUV radiation beam dumps 103, 104.

Figure 11:
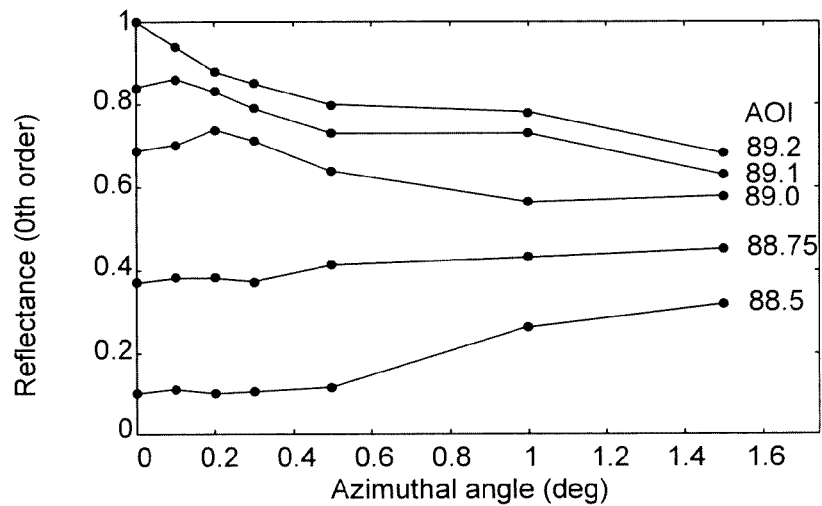
FIG. 11 is a chart depicting changes in zero-order reflectance with azimuthal angle.

FIG. 11 shows how zero-order diffraction of a grating varies as a function of the azimuthal angle (where an azimuthal angle of 0 degrees is taken to be the position at which the longitudinal axis of the grooves of the grating are parallel to the plane of incidence of the EUV radiation beam) for a grating with a pitch, p=900 nm and a groove depth, d=200 nm. In FIG. 10, it can be seen that for an angle of incidence of 89.2 degrees (e.g., a grazing angle of 0.8 degrees), an azimuthal rotation of 0.5 degrees results in an attenuation of 20% (i.e., 80% of the radiation of the branch EUV radiation beam $B_a$ is reflected in a reflected EUV radiation beam).

In some embodiments, one or more gratings provided in an attenuation apparatus may be provided with actuators to rotate the grating both azimuthally and so as to vary the grazing angle.

It will be appreciated that while the attenuator 60 comprises two gratings 61, 62, in other embodiments, a single grating is provided. For example, where a single azimuthally adjusted grating is provided, only one moving part is required, thereby avoiding any synchronization, such as synchronization that may be performed between the gratings 61, 62 in the attenuator 60.

Figure 12:
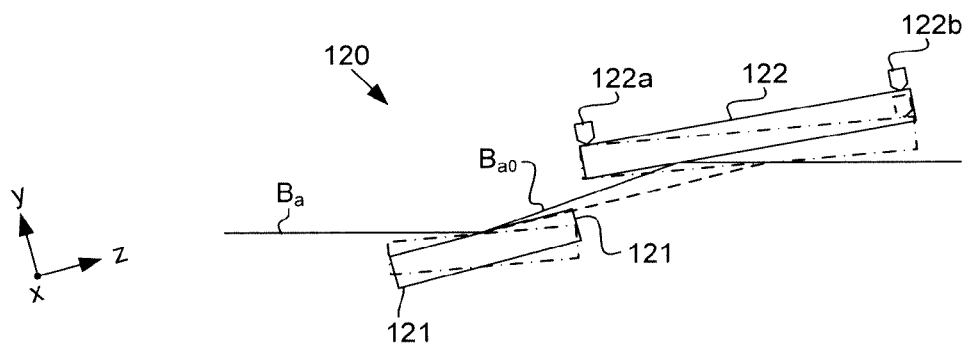
FIG. 12 is a schematic illustration of an attenuator comprising a grating and a mirror.

Furthermore, it will be appreciated that combinations of attenuators may be provided within an attenuation apparatus. For example, reflective optic-based (e.g. mirror-based) attenuators, such as the mirrors 31, 32, may be utilized in conjunction with grating-based attenuators, such as the gratings 61, 62. As shown in FIG. 12, an attenuator 120 may comprise a grating 121 in combination with a mirror 122. The grating 121 may be equivalent to the grating 61 of FIG. 6 and arranged to receive the branch EUV radiation beam $B_a$. The zero-order reflection from the grating 121 is directed to the mirror 122. In order to avoid the translation of the grating 62 that occurs in the arrangement of FIG. 6, the mirror 122 is extended (in the z-direction) such that the zero-order reflection from the grating 121 is incident on the surface of the mirror 122 for the whole of the rotational adjustment extent of the grating 121 without translation of the mirror 122. Actuators 122a, 122b are provided at respective ends of the mirror 122 in order to adjust the angle position of the mirror 122 with respect to the incoming reflected EUV radiation beam $B_{a0}$. The arrangement of FIG. 12 may therefore provide a shorter response time than the arrangement of FIG. 6 as the mirror 122 does not undergo translation in the z-direction. Additionally, through use of the mirror 122 in place of the grating 62, difficulties and costs in manufacturing and using a relatively large grating may be avoided.

In another example arrangement, an azimuthally adjusted grating (as described with reference to FIGS. 10a, 10b may be provided in series with a grating that rotates about the x-axis (e.g., the gratings 61, 62). Such an arrangement may be beneficial to provide an attenuator that can provide a large dynamic range of attenuations, and an attenuator that can provide a high bandwidth (i.e., a high number of adjustments per unit of time). That is, a grating which is subject to azimuthal rotation will experience greater bending forces, and may therefore have greater stiffness, in the xz plane, compared to the gratings which rotate about the x-axis (which will experience greater bending forces in the yz plane). The greater stiffness may result in a higher resonance frequency of the azimuthally adjusted grating, which may in turn allow for an increased bandwidth. As such, a combination of the grating 61 with the grating 101 may provide a system which can provide a high dynamic attenuation range and a high adjustment bandwidth.

More generally, any combination and number of gratings (both azimuthally rotated and/or rotated about the x-axis), mirrors and static attenuators (e.g., gas chamber based attenuators, etc.) may be provided in an attenuation apparatus. Additionally, it will be appreciated that different ones of the attenuation apparatuses 15a-15n may comprise different arrangements of attenuators depending on the requirements of the lithographic apparatuses arranged to receive the branch radiation beams $B_a$-$B_n$.

It is to be understood that a reflective grating may be manufactured in any of a plurality of suitable ways. In one embodiment, gratings may be produced by processing a silicon wafer using a plurality of etchants in order to provide ridges with surfaces that are substantially atomically flat. Etchants such as potassium hydroxide (KOH), for example, may be used. Alternatively, or additionally, deep reactive-ion etching (DRIE) may be used. For example, DRIE may be used to generate grooves having vertical walls.

A coating may be deposited on the etched mirror so as to increase grazing incidence reflection and decrease absorption of radiation having a desired wavelength (for example EUV radiation). For example, molybdenum (Mo) or ruthenium (Ru) which have a high grazing incidence reflectivity for radiation having wavelengths of 13.5 nm may be used. Other coatings may be selected for other wavelengths of radiation. Additionally, materials may be selected for resistance to conditions likely to be present within the EUV radiation beam splitting apparatus, such as the generation of EUV radiation-induced plasma.

In some embodiments, an amorphous metal (or metal glass), such as a mix of Mo and Ru, may be deposited on the etched layer to provide a reflective coating. The amorphous structure of the metal glass may be used to provide smooth surfaces with high reflectivity for a desired wavelength.

It will be appreciated that any other appropriate materials such as zirconium (Zr) may be used. Different coating materials or compositions may be applied to different parts of the etched surface. For example, with reference to FIGS. 7 and 8, different coatings may be applied to the $S_1$, $S_2$ and $S_3$ faces. By applying different coatings to different portions of the etched surface, thermal expansion of the faces may be compensated.

Where a reflective coating is provided, a further coating may be applied to the reflective coating. For example, oxides, nitrides, carbides, etc., may be applied in order to increase the stability and resistance of the reflective coating to conditions likely to be present.

Where a reflective coating is provided, one or more interface layers may be provided between the etched material (e.g. Si) and the reflective coating to reduce surface roughness and increase thermal conductivity. For example, an interface layer of graphene may be provided.

While not depicted in the Figures, cooling channels may be provided on a reverse side of the gratings (i.e. a side which does not receive an EUV radiation beam). Such cooling channels may be arranged to receive a liquid coolant such as water, or a two-phase liquid/gas coolant.

While it is described above that the etched surface may be silicon, it is to be understood that other materials may be used. Examples of other materials which may be anisotropically etched to provide a grating include germanium (Ge), gallium arsenide (GaAs), silicon-germanium (SiGe), indium phosphide (InP) and indium arsenide (InAs). Generally, however, any suitable material may be used.

A suitable grating may be manufactured as described above. The grating may then be copied using a process such as thermoplastic molding in a metal glass, or by stamping, for example.

One or more of the attenuation apparatuses $15a$-$15n$ may form part of a control loop for control of a lithographic system. For example, with reference to FIG. 2, a controller 25 may be arranged to receive data from a lithographic apparatus LA, and/or the source SO, indicating an amount of EUV radiation, or more generally that an increase, decrease, or cease of received EUV power is required.

For example, it may be determined that a reduction in EUV power is required during acceleration or deceleration of the support structures MT and WT during an exposure of a wafer. In response to receipt of such data, the controller may be operable to cause one or more actuators of the attenuation apparatus $15a$ to operate. For example, with reference to FIG. 6, upon receipt of data indicating that a reduction in EUV power is required, the processor may be operable to cause one or more actuators to rotate the gratings 61, 62 to increase their respective angles of incidence. That is, in some embodiments, the actuators of each element (e.g., grating, mirror, etc.) within an attenuation apparatus may be adjustable independently of one another.

As a further example, controller 25 may be part of a feedback control loop arranged to detect an intensity of the EUV radiation received at the lithographic apparatus $LA_a$ and to adjust the attenuation of the branch EUV radiation beam $B_a$ in order to maintain the intensity at the lithographic apparatus $LA_a$ at a predetermined value or within a predetermined range.

It will be appreciated that while the embodiments described above are described with reference to the attenuation apparatus $15a$, the attenuation apparatuses $15b$-$15n$ may be similarly implemented.

While it is described above that a respective attenuation apparatuses $15a$-$15n$ is provided for each branch EUV radiation beam, it will be appreciated that in other embodiments, an attenuation apparatus may be provided for only one or some of the branch EUV radiation beams. Further, a single attenuator may be provided for a plurality of branch EUV radiation beams. That is, while the attenuation apparatuses $15a$-$15n$ are shown disposed outside of the splitter 20, in other embodiments, an attenuation apparatus as described herein may be disposed within the splitter 20 so as to attenuate a plurality of branch EUV radiation beams. For example, to attenuate all of the branch EUV radiation beams $B_b$-$B_n$ together, an attenuation apparatus may be provided immediately after the branching of the first branch EUV radiation beam $B_a$. Indeed, as will be apparent to the skilled person from the teaching herein, any combination or configuration of attenuation apparatuses may be provided.

More generally, it will be readily appreciated from the teaching herein that an attenuator 15 as generally described above may be positioned elsewhere within the lithographic system before the substrate. For example, with reference to FIG. 2, an attenuator may be positioned within the illuminator IL.

A lithographic system according to an embodiment of the invention may further comprise one or more mask inspection apparatuses. The EUV radiation beam splitting apparatus 20 may direct a portion of the main EUV radiation beam B to the mask inspection apparatus. The mask inspection apparatus may use this radiation to illuminate a mask and uses an imaging sensor to monitor radiation reflected from the mask MA. The mask inspection apparatus may include optics (e.g. mirrors) configured to receive a branch EUV radiation beam from EUV radiation beam splitting apparatus 20 and direct the EUV radiation beam at a mask. The mask inspection apparatus may further include optics (e.g. mirrors) configured to collect radiation reflected from the mask and form an image of the mask at the imaging sensor. The mask inspection apparatus may be similar to the lithographic apparatus $LA_a$ shown in FIG. 2, with the substrate table WT replaced with an imaging sensor. In some embodiments, the lithographic system may comprise two mask inspection apparatuses to allow for some redundancy. This may allow one mask inspection apparatus to be used when the other mask inspection apparatus is being repaired or undergoing maintenance. Thus, one mask inspection apparatus is always available for use. A mask inspection apparatus may use a lower power EUV radiation beam than a lithographic apparatus.

The term "EUV radiation" may be considered to encompass electromagnetic radiation having a wavelength within the range of 5-20 nm, for example within the range of 13-14 nm. EUV radiation may have a wavelength of less than 10 nm, for example within the range of 5-10 nm such as 6.7 nm or 6.8 nm.

The lithographic apparatuses $LA_a$-$LA_n$ may be used in the manufacture of ICs. Alternatively, the lithographic apparatuses $LA_a$-$LA_n$ described herein may have other applications. Possible other applications include the manufacture of integrated optical systems, guidance and detection patterns for magnetic domain memories, flat-panel displays, liquid-crystal displays (LCDs), thin-film magnetic heads, etc.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. An apparatus for adjusting an intensity of radiation, comprising:
 a grating configured to receive a radiation beam and to direct at least a portion of the radiation beam in a first direction as a first reflected radiation beam; and
 one or more first actuators operable to rotate the grating to adjust a grazing angle between the radiation beam and a surface of the grating so as to vary an intensity of the first reflected radiation beam, wherein the one or more first actuators are operable to translate the grating such that an attenuated radiation beam is directed from an attenuation apparatus in a fixed position and direction.

2. The apparatus of claim 1, wherein the one or more first actuators are operable to rotate the grating through an angle of less than 1 degree.

3. The apparatus of claim 1, wherein the one or more first actuators are operable to rotate the grating about a normal to a surface of the grating so as to vary an angle between one or more grooves of the grating and a plane of incidence of the first radiation beam.

4. The apparatus of claim 1, wherein the grating is operable to direct at least one diffracted radiation beam away from the first direction.

5. The apparatus of claim 1, further comprising:
 a reflective optic operable to receive the first reflected radiation beam and to direct at least a portion of the first reflected radiation beam in a second direction in a second reflected radiation beam; and
 one or more second actuators arranged to adjust an orientation of the reflective optic so as to vary an intensity of the second reflected radiation beam.

6. The apparatus of claim 5, wherein the reflective optic comprises a second grating.

7. The apparatus of claim 5, wherein the one or more second actuators are operable to translate the reflective optic such that an attenuated radiation beam is directed from the attenuation apparatus in a fixed position and direction.

8. The apparatus of claim 5, wherein the reflective optic has an extent in a direction of propagation of the first radiation beam, such that the first reflected radiation beam is incident upon a reflective surface of the reflective optic for all of a predetermined range of orientations of the grating.

9. The apparatus of claim 8, further comprising a controller arranged to control the one or more first actuators to adjust the orientation of the grating.

10. The apparatus of claim 9, wherein the controller is arranged to receive indications of a radiation intensity from a sensor and to control the one or more first actuators in response to receipt of said indications.

11. The apparatus of claim 1, wherein the radiation comprises EUV radiation.

12. A lithographic system comprising:
 a radiation source operable to produce a first radiation beam;
 an attenuation apparatus comprising:
  a grating configured to receive a radiation beam and to direct at least a portion of the radiation beam in a first direction as a first reflected radiation beam; and
  one or more first actuators operable to rotate the grating to adjust a grazing angle between the radiation beam and a surface of the grating so as to vary an intensity of the first reflected radiation beam, wherein the one or more first actuators are operable to translate the grating such that an attenuated radiation beam is directed from the attenuation apparatus in a fixed position and direction wherein the attenuation apparatus is arranged to receive a first radiation beam, the first radiation beam comprising at least a portion of the main radiation beam; and
 at least one lithographic apparatus, the at least one lithographic apparatus being arranged to receive an attenuated radiation beam from the attenuation apparatus.

13. The lithographic system of claim 12, further comprising:
 a radiation beam splitting apparatus arranged to receive the main radiation beam and output at least one branch radiation beam;
 wherein the first radiation beam comprises at least a portion of the at least one branch radiation beam.

14. The lithographic system of claim 13, wherein:
 the radiation beam splitting apparatus is arranged to output a plurality of branch radiation beams; and
 the lithographic system comprises a respective one of the attenuation apparatus for each of the plurality of branch radiation beams, each respective one of the attenuation apparatus arranged to receive a respective one of the plurality of branch radiation beams.

15. The lithographic system of claim 12, wherein the radiation source comprises one or more free electron lasers.

16. The lithographic system of claim 12, wherein the at least one lithographic apparatus comprises one or more mask inspection apparatus.

* * * * *